United States Patent
Hiroyuki et al.

(10) Patent No.: US 6,933,001 B2
(45) Date of Patent: Aug. 23, 2005

(54) OPTICAL FILTER AND METHOD OF MANUFACTURING THE SAME

(75) Inventors: Abe Hiroyuki, Tokyo (JP); Yu Mimura, Tokyo (JP); Kazuyou Mizuno, Tokyo (JP)

(73) Assignee: The Fukukawa Electric Company, Ltd., Yokohama (JP)

( * ) Notice: Subject to any disclaimer, the term of this patent is extended or adjusted under 35 U.S.C. 154(b) by 430 days.

(21) Appl. No.: 10/047,459

(22) Filed: Jan. 14, 2002

(65) Prior Publication Data
US 2002/0155213 A1 Oct. 24, 2002

(30) Foreign Application Priority Data
Jan. 31, 2001 (JP) .......................................... 2001-023700

(51) Int. Cl.⁷ .......................... C23C 14/54; C23C 16/52; G02B 1/10; G02B 5/20
(52) U.S. Cl. .............................. 427/10; 427/9; 427/162; 427/166; 427/255.7; 118/665; 118/668; 359/580; 359/588; 359/885
(58) Field of Search ................................ 427/9, 10, 162, 427/164, 165, 166, 255.15, 255.7, 419.3; 118/668, 665; 359/580, 588, 885

(56) References Cited
U.S. PATENT DOCUMENTS

| | | | | |
|---|---|---|---|---|
| 3,637,294 A | * | 1/1972 | Berthold, III | 359/582 |
| 4,144,837 A | * | 3/1979 | Johnston | 118/680 |
| 4,311,725 A | * | 1/1982 | Holland | 427/10 |
| 4,527,510 A | * | 7/1985 | Arndt | 118/669 |
| 5,131,752 A | * | 7/1992 | Yu et al. | 356/369 |
| 5,151,295 A | * | 9/1992 | Kawahara et al. | 427/9 |
| 5,425,964 A | * | 6/1995 | Southwell et al. | 427/10 |
| 5,503,707 A | * | 4/1996 | Maung et al. | 438/5 |
| 5,661,669 A | * | 8/1997 | Mozumder et al. | 702/84 |
| 6,481,369 B1 | * | 11/2002 | Takahashi et al. | 118/723 EB |
| 6,490,497 B1 | * | 12/2002 | Mitsuhashi et al. | 700/121 |
| 2003/0003605 A1 | * | 1/2003 | Chen et al. | 438/8 |

* cited by examiner

Primary Examiner—Timothy Meeks
Assistant Examiner—Wesley D. Markham
(74) Attorney, Agent, or Firm—Oblon, Spivak, McClelland, Maier & Neustadt, P.C.

(57) ABSTRACT

The optical thickness of a film formed on a substrate is controlled precisely to manufacture an optical filter having an accurate optical thickness. Time is counted during a film being formed on a substrate to note time points t with respect to a reference time set in advance. At least one of two optical characteristics of energy transmittance and energy reflectance when the film being formed on the substrate is irradiated with monitoring light is expressed by a function f(t) of the time points t based on a theoretical formula of the optical characteristic. The optical characteristic is measured by irradiating the film with the monitoring light at the time points t. A designed thickness achieving time at which the optical thickness of the film designed thickness is predicted. The film formation is stopped at the designed thickness achieving time, thereby obtaining the optical filter.

10 Claims, 3 Drawing Sheets

OPTICAL FILTER AND METHOD OF MANUFACTURING THE SAME

BACKGROUND OF THE INVENTION

1. Field of the Invention

The present invention relates to an optical filter for use in optical communications and other fields, and to a method of manufacturing the optical filter.

2. Description of the Related Art

Optical filters such as wavelength-selective pass filters (band pass filters) are widely used in optical communications. The band pass filters allow only light beams that are in a preset wavelength band out of all the light beams having reached the filter to pass.

One of the methods used in manufacturing optical filters of this type is to form a filter film on a substrate by vacuum evaporation, sputtering or the like.

FIG. 2 shows in schematic diagram an example of vacuum evaporation apparatus as a film forming apparatus. In FIG. 2, an evaporation apparatus 30 has therein a film forming area 1 for film formation by vacuum evaporation. In the area 1, a substrate holder 2 is provided to place thereon a substrate 3 on which a film is formed. Evaporation sources 5a and 5b are placed below the substrate holder 2. The components in the film forming area 1 is shown in section in FIG. 2.

Further, the evaporation apparatus 30 is provided with an operation unit (not shown). The apparatus is driven by operation of the operation unit, so that materials evaporated from the evaporation sources 5a and 5b are deposited on the substrate 3 to form a film (thin film) 4.

Arranged outside the evaporation apparatus 30 are a light source 7 that emits monitoring light, an optical fiber 8 for guiding the light emitted from the light source 7 to the evaporation apparatus 30, a light receiver 12, a computer 14, etc.

The monitoring light emitted from the light source 7 travels through the optical fiber 8 and enter the evaporation apparatus 30 from a window 9 provided in a lower part of the apparatus. The monitoring light entered from the window 9 travels straight across the film forming area 1 to reach the film 4 and the substrate 3 as indicated by A in FIG. 2. Some of the light passes through an optical fiber 11 provided above the evaporation apparatus 30 and reaches the light receiver 12.

A signal reflecting the amount of light that has reached the light receiver 12 is sent through a signal cable 13 to the computer 14, which controls the thickness of the film to be formed in accordance with the information of the signal.

To elaborate, the computer 14 measures, on the basis of the amount of light that has reached the light receiver 12, a change in one of two optical characteristics consisting of energy transmittance and energy reflectance when the monitoring light irradiates the film 4 that is in the process of formation. The measured change in energy transmittance, or energy reflectance, of the monitoring light is used to judge whether or not the film in process reaches the objective thickness. After it is judged that the objective thickness is attained, a signal for stopping the film formation is sent through a signal cable 15 to a driving unit (not shown) of the evaporation apparatus 30.

Receiving the signal, evaporation source shutters 6a and 6b cover right above the evaporation sources 5a and 5b, respectively, to stop the film formation.

A multi-layer optical filter in which thin films of different materials are layered can be manufactured by repeating the following operations. A material for forming an N-th layer (N is a positive integer) is evaporated from the evaporation source 5a to form the N-th layer. Subsequently, a material for forming an (N–1)-th layer, which is different from the material for forming the N-th layer, is evaporated from the evaporation source 5b to form the (N–1)-th layer. Thereafter, a material for forming an (N–2)-th layer, which is different from the material for forming the (N–1)-th layer, is evaporated from the evaporation source 5a to form the (N–2)-th layer.

FIG. 3 is a schematic diagram showing an example of the multi-layer film laminated as above. In FIG. 3, a multi-layer film having L layers in total is formed on the substrate 3 with a refractive index of $n_s$. The layer the farthest from the substrate 3 is a first layer, the underneath layer is a second layer, layers below them are thus denoted in order and the nearest layer to the substrate is an L-th layer. The first layer has a refractive index of $n_1$, the second layer has a refractive index of $n_2$, a j-th layer has a refractive index of $n_j$, the L-1 layer has a refractive index of $n_{L-1}$, and the L-th layer has a refractive index of $n_L$. The first layer has a physical thickness of $d_1$, the second layer has a physical thickness of $d_2$, the j-th layer has a physical thickness of $d_j$, the L-1 layer has a physical thickness of $d_{L-1}$ and the L-th layer has a physical thickness of $d_L$. The optical thickness is obtained by multiplying the refractive index by the physical thickness. For example, the optical thickness in the j-th layer is $n_j d_j$.

FIG. 4 is a graph showing the relation between the optical thickness and the energy transmittance in the case where a multi-layer film having three layers in total is formed on the substrate 3. It is understood from the graph that formation of each layer should be stopped at the extremal of the curve when $n_1 d_1 = n_2 d_2 = n_3 d_3 = \lambda/4$ is satisfied.

Prior art therefore judges that the energy transmittance reaches its extremal when the direction of change in energy transmittance (increase or decrease) is reversed. Alternatively, fitting or other processing is performed on the relation between the energy transmittance and the optical thickness (or time count during film formation which is almost in proportion to the optical thickness) obtained in the vicinity of the above extremal to put it into a simple equation such as quadratic curve or sine-wave curve in order to judge whether the extremal on the characteristic curve of, e.g., FIG. 4 is reached or not. When to stop the formation of the film 4 in each layer has been judged in those ways in prior art.

Methods similar to those methods of judging when to stop formation of each layer based on the change in energy transmittance have been employed in judging when to stop formation of each layer on the basis of the change in energy reflectance.

However, there are problems in the methods of judging when to stop formation of the film in which the extremal of the change in the amount of light is obtained directly and only from the change in energy transmittance or in energy reflectance as above. The problems include that it is only after the extremal is reached that the judging of the extremal can be made, and that making the judgement takes a while resulting in increase in the difference between the designed optical thickness and the optical thickness actually obtained.

To elaborate the above, it is common to make a computer or the like to judge that the extremal is reached only after the change in energy transmittance or in energy reflectance heads to the reverse direction for a certain period of time from the real extremal. This is intended to avoid erroneously judging a minute falter caused by noise or the like as the extremal. Thus the judgement of the extremal is made after a while from the real extremal. Also it takes no small amount of time to send, after the judgement is made, a signal for stopping the film formation to the film forming apparatus and to actually stop the film formation. Thus it has been impossible to prevent the difference between the designed optical thickness and the actual optical thickness from increasing.

When employing the method of using fitting or the like to judge that the energy transmittance or the energy reflectance reaches its extremal, on the other hand, it is important that the change in actual energy transmittance or energy reflectance should substantially coincide with the simple equation such as quadratic curve and sine-wave curve. However, the change and the equation substantially coincide with each other only when data of very narrow range in the vicinity of the extremal are used.

In addition, the actual energy transmittance or energy reflectance rarely makes a smooth curve and a change that seems like the extremal in a very narrow range often takes place. For that reason, a wrong point may be judged as the extremal, thereby increasing the difference from the designed thickness even more.

SUMMARY OF THE INVENTION

The object of the present invention is therefore to provide a method of manufacturing an optical filter in which the optical thickness of a film to be formed can be controlled more precisely and to provide an optical filter having an accurate optical thickness.

In one embodiment, the invention comprises a method for manufacturing an optical filter comprising depositing a material on a substrate, predicting a deposition stop time during the depositing of the material but prior to reaching the predicted stop time, and stopping deposition substantially at the predicted stop time.

In some other embodiments, the measure is a method of manufacturing an optical filter, comprising the steps of:

counting time during a film is being formed on a substrate so as to note time points t with respect to a reference time that is set in advance;

expressing at least one of two optical characteristics consisting of energy transmittance and energy reflectance when monitoring light irradiates the film that is in the process of being formed on the substrate as a function f(t) of the time points t on the basis of the theoretical formula of the optical characteristic, the function having a theoretical constant $a_k$ (k is an integer equal to or greater than 0);

measuring the optical characteristic by irradiating the film with the monitoring light at the time points t;

calculating a theoretical value of the optical characteristic from the function f(t);

compensating the theoretical constant $a_k$ so as to minimize the difference between the measured value of the optical characteristic and the theoretical value of the optical characteristic in order to obtain a proper constant $a_k'$ at any time during the film formation;

predicting, on the basis of the proper constant $a_k'$, a designed thickness achieving time at which the film being formed reaches a designed optical thickness; and stopping the film formation at the designed thickness achieving time.

According to a another aspect of the present invention, a measure to solve the problems is the structure of the first aspect of the invention, wherein the designed thickness achieving time is predicted after the amount of change in the proper constant $a_k'$ that is obtained at any time during the film formation falls within a preset acceptable range, and the film formation is stopped at the designed thickness achieving time predicted.

According to another aspect of the present invention, a measure to solve the problems is the structure of the first or second aspect of the invention, wherein the function f(t) is a function having a compensation constant term, the term being dependent on an optical characteristic measuring device.

According to a another aspect of the present invention, a measure to solve the problems is an optical filter manufactured by the method of manufacturing an optical filter of the first, second or third aspect of the invention.

In the present invention having the above structures, time is counted during film formation to note time points t with respect to a reference time that is set in advance. At least one of two optical characteristics consisting of energy transmittance and energy reflectance when the film is irradiated with monitoring light is expressed by a function f(t) of the time points t. The function f(t) has a theoretical constant $a_k$, which is compensated on the basis of the function f(t) and a measured value of the optical characteristic to obtain a proper constant $a_k'$. Based on the proper constant $a_k'$, a designed thickness achieving time at which the optical thickness of the film reaches a designed thickness is predicted.

The designed thickness achieving time is predicted on the basis of the proper constant $a_k'$ of the function f(t) which in turn has its base on the theoretical formula of the optical characteristic, as described above. Therefore the prediction can be very precise. The film formation is stopped at this designed thickness achieving time in the present invention, and hence stopping the film formation is not delayed or the timing for stopping the film formation can not be wrong unlike the example of prior art. The present invention is thus capable of precisely forming a film with the designed thickness and manufacturing an optical filter that has an accurate optical thickness.

The optical filter of the present invention is manufactured by the above method of manufacturing an optical filter in accordance with the present invention. Therefore the optical filter can have an optical thickness exactly as designed through a precise control of the optical thickness.

DETAILED DESCRIPTION

An embodiment of the present invention will be described below with reference to the drawings. Components having the same names as those in the example of prior art are denoted by the same reference symbols throughout the description of this embodiment, and explanations of such components will not be repeated.

In this embodiment, an optical filter according to the present invention is a band pass filter (BPF) obtained by layering a film (thin film) 4 ninety-six times on a product substrate 3. The band pass filter is manufactured by using a vacuum evaporation apparatus 30 as the one shown in FIG. 2, for example.

The filter obtained by layering the film 4 ninety-six times is structured (designed) to include an H layer, an L layer and a 6L layer which are laminated on the substrate 3. The H layer is formed from $Ta_2O_5$ to have an optical thickness one fourth the central wavelength (here, 1550 nm). The L layer is formed from $SiO_2$ to have an optical thickness one fourth the central wavelength. The 6L layer is formed from $SiO_2$ to have an optical thickness six fourth the central wavelength. The layers are laminated as follows.

Medium |L·(HL)$^7$·H·6L·H·(LH)$^7$·L·(HL)$^7$·H·6L·H·(LH)$^7$ (HL)$^7$·H·6L·H·(LH)$^7$| Substrate Note that, in the structure, (HL)$^7$ means that seven H layers and seven L layers are laminated alternately (fourteen layers in total), and (LH)$^7$ means that seven L layers and seven H layers are laminated alternately (fourteen layers in total).

In this embodiment, the back side of the substrate 3, i.e., the side opposite to the side on which the film 4 is to be formed by evaporation, receives anti-reflection processing in advance.

The optical filter of this embodiment is fabricated by the unique method of manufacturing an optical filter which will be described below. In the following description, one will find how to fabricate the optical filter of this embodiment. Throughout the description of how to fabricate the optical filter of this embodiment, light having a wavelength identical with the central wavelength is used as the light for irradiating the substrate 3 during film formation (monitoring light).

The first step in manufacturing the optical filter of this embodiment is to count time during a film is formed on the substrate 3 so as to note time points t with respect to a reference time that is set in advance. The reference time in this embodiment is set to the starting time at which formation of the film 4 in each layer is started (t=0).

An energy transmittance T is chosen as the optical characteristic of the monitoring light while the light irradiates the film 4 being formed on the substrate 3. Based on the theoretical formula of the energy transmittance T, the energy transmittance T is expressed by a function f(t) of the time points t which has a theoretical constant $a_k$ (k is an integer equal to or greater than 0).

Figure 3:
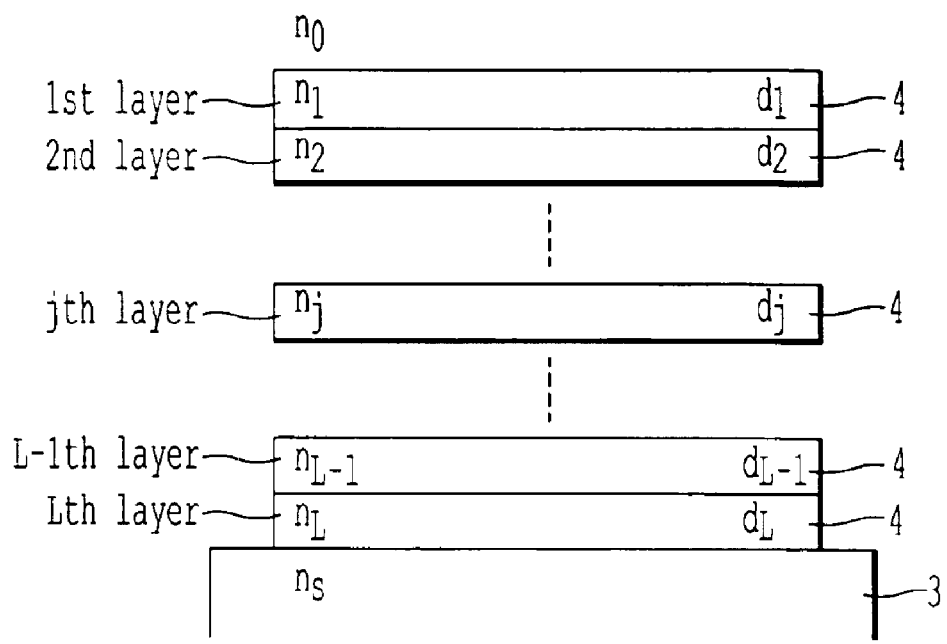
FIG. 3 is a sectional explanatory view showing a substrate with a refractive index of $n_s$ in the medium whose refractive index is $n_0$, the substrate having thereon L layers of films each having an optical thickness of $n_j d_j$.
Figure 4:
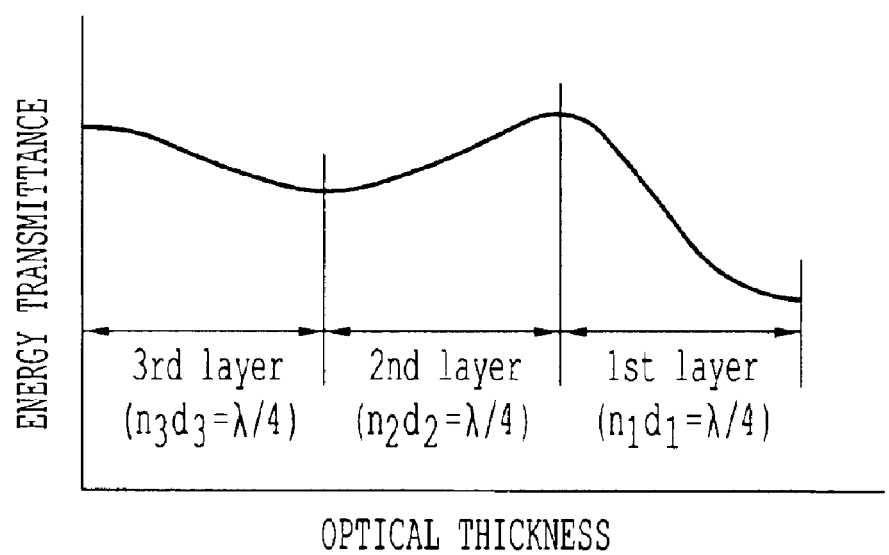
FIG. 4 is a graph showing an example of the relation between the optical thickness and the energy transmittance when three layers of films are to be formed on a substrate.

Now, the relation between the optical thickness and the energy transmittance of the monitoring light will be described to explain how the computer 14 figures the time to stop film formation. In the case of the multi-layer film having L layers in total as shown in FIG. 3, the relation between the optical thickness and the energy transmittance of the monitoring light is given from the energy transmittance of the multi-layer film which is expressed as Equation 1.

$$= \frac{4n_0n_s}{(n_0m_{11} + n_sm_{22})^2 + (n_0n_sm_{12} + m_{21})^2} \quad \text{Equation 1}$$

In Equation 1, parameters $m_{11}$, $m_{12}$, $m_{21}$ and $m_{22}$ are elements of a characteristic matrix M given as Equation 2 in every layer, and are the product of characteristic matrices of the first to L-th layers (a characteristic matrix $M_1$, a characteristic matrix $M_2$, ..., and a characteristic matrix $M_L$). A characteristic matrix $M_j$ of the j-th layer ($1 \leq j \leq L$) is obtained from Equation 3, and $\delta_j$ in Equation 3 is expressed as Equation 4. As described above, $n_j$ represents the refractive index of the j-th layer and $d_j$ denotes the physical thickness of the j-th layer. $\lambda$ is the wavelength of the monitoring light. In Equation 2 and Equation 3, i is used to name an imaginary number.

$$M = \begin{pmatrix} m_{11} & in_{12} \\ in_{23} & m_{22} \end{pmatrix} = M_1 M_2 \cdots M_{L-1} M_L \quad \text{Equation 2}$$

$$M_j = \begin{pmatrix} \cos\delta_j & in_j^{-1}\sin\delta_j \\ in_j\sin\delta_j & \cos\delta_j \end{pmatrix} \quad \text{Equation 3}$$

$$\delta_j = 2\pi \times \frac{n_j d_j}{\lambda} \quad \text{Equation 4}$$

With $n_j d_j$ in Equation 4 being substituted by a designed value of the optical thickness in the j-th layer, Equations 1 to 4 are processed to obtain a theoretical value of the final energy transmittance regarding the monitoring light during forming the j-th layer. In this way, a theoretical value of the final energy transmittance regarding the monitoring light can be obtained for each of the first to L-th layers.

As has been well known, every film 4 in the multi-layer film that is formed to fabricate the optical filter used in optical communications, such as the band pass filter, is designed to have an optical thickness that is obtained by multiplying a reference wavelength by a preset multiple. The reference wavelength is set for designing the thickness of the film and is called the central wavelength. The optical thickness of one film 4 is usually set to a value obtained by multiplying the central wavelength by about 0.25 (¼) or by an integral multiple of 0.25 in most optical filters.

Accordingly, if the monitoring light is light having a wavelength identical with the central wavelength, $\delta_j$ in Equation 4 is an integral multiple of $\pi/2$. Then the formation of each layer should be stopped at the extremal on the energy transmittance change curve (relational expression of the optical thickness and the energy transmittance).

Figure 1:
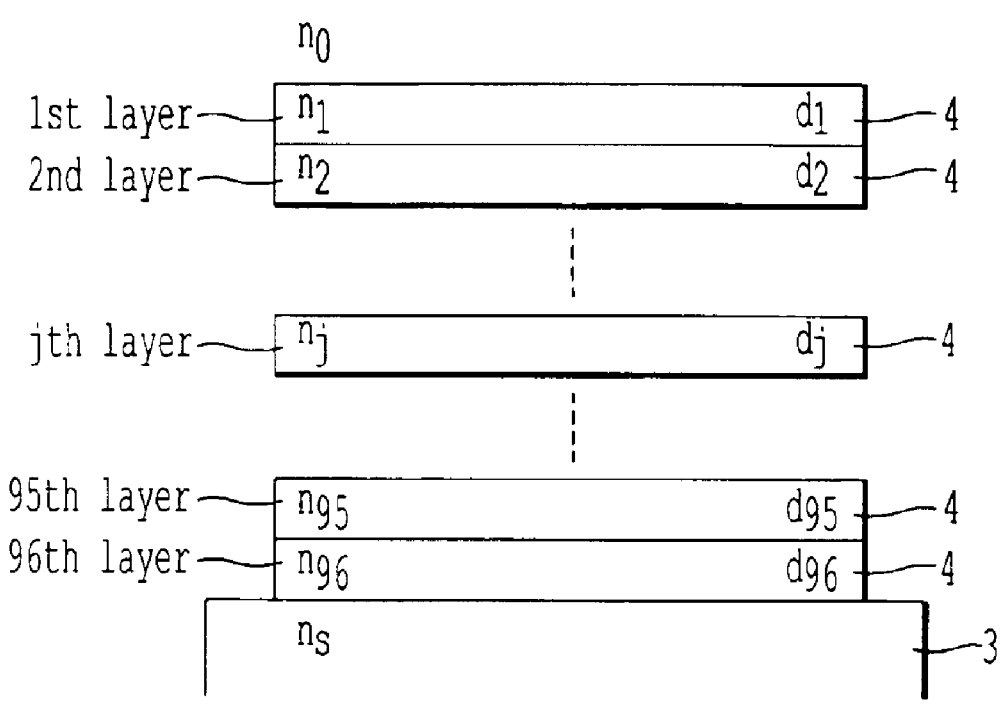
FIG. 1 is a sectional explanatory view schematically showing an optical filter according to one embodiment of the present invention, the filter being arranged in a medium that has a refractive index of $n_0$.

Now, the procedure for obtaining the function f(t) is described. First, the film 4 in each layer $n_1, n_2, \ldots n_j, \ldots, n_{95}, n_{96}$ is numbered starting from the one the farthest from the substrate 3 as shown in FIG. 1. Assuming that the film 4 in the j-th layer is now being formed, characteristic matrices of from the film 4 in the ninety-sixth layer to the film 4 in the (j+1)-th layer which have already been formed are given as $M_b$. Then $M_b$ can be expressed by Equation 5 collectively.

$$M_b = \begin{pmatrix} b_{11} & ib_{12} \\ ib_{21} & b_{22} \end{pmatrix} \quad \text{Equation 5}$$

In Equation 5, $b_{11}$, $ib_{12}$, $ib_{21}$ and $b_{22}$ are obtained from the product of the characteristic matrices of from the film 4 in the ninety-sixth layer to the film 4 in the (j+1)-th layer, and Equations 2 through 4 are used for the calculation.

The characteristic matrix of the film 4 in the layer being formed (here, the j-th layer) is expressed as Equation 3. Then the expressions of the characteristic matrices are summed up into Equation 6.

$$M = M_j M_b = \begin{pmatrix} \cos\delta_j & in_j^{-1}\sin\delta_j \\ in_j\sin\delta_j & \cos\delta_j \end{pmatrix} \begin{pmatrix} b_{11} & ib_{12} \\ ib_{21} & b_{22} \end{pmatrix}$$

$$= \begin{pmatrix} b_{11}\cos\delta_j - n_j^{-1}b_{21}\sin\delta_j & ib_{12}\cos\delta_j + in_j^{-1}b_{22}\sin\delta_j \\ in_jb_{11}\sin\delta_j + ib_{21}\cos\delta_j & -n_jb_{12}\sin\delta_j + b_{22}\cos\delta_j \end{pmatrix}$$

The energy transmittance of the multi-layer film is expressed by the theoretical formula of Equation 1 using the elements of the characteristic matrices, as described above. Accordingly, the energy transmittance T during the film 4 of the j-th layer is being formed is expressed as Equation 7.

$$= \frac{4n_0 n_j^2 n_s}{A\cos^2\delta_j + 2B\sin\delta_j\cos\delta_j + C\sin^2\delta_j} \quad \text{Equation 7}$$

In Equation 7, A, B and C are substitutes for constants shown in Equations 8 to 10.

$$A = n_0^2 n_j^2 b_{11}^2 + 2n_0 n_j^2 n_s b_{11}b_{22} + n_j^2 n_s^2 b_{22}^2 + n_0^2 n_j^2 n_s^2 b_{12}^2 + \quad \text{Equation 8}$$
$$2n_0 n_j^2 n_s b_{12}b_{21} + n_j^2 b_{21}^2$$

$$B = -n_0^2 n_j b_{11}b_{21} - n_0 n_j^3 n_s b_{11}b_{12} - n_0 n_j n_s b_{21}b_{22} - \quad \text{Equation 9}$$
$$n_j^3 n_s^2 b_{12}b_{22} + n_0^2 n_j n_s^2 b_{12}b_{22} + n_0 n_j^3 n_s b_{11}b_{12} +$$
$$n_0 n_j n_s b_{21}b_{22} + n_j^3 b_{11}b_{21}$$

$$C = n_0^2 b_{21}^2 + 2n_0 n_j^2 n_s b_{21}b_{12} + n_j^4 n_s^2 b_{12}^2 + n_0^2 n_s^2 b_{22}^2 + \quad \text{Equation 10}$$
$$2n_0 n_j^2 n_s b_{11}b_{22} + n_j^4 b_{11}^2$$

Equation 7 can be changed into Equation 11 by using a constant β that satisfies Equations 12 and 13.

$$= \frac{8n_0 n_j^2 n_s}{(A+C) + \sqrt{(A-C)^2 + 4B^2}\,\cos(2\delta_j + \beta)} \quad \text{Equation 11}$$

$$\sin\beta = \frac{-2B}{\sqrt{(A-C)^2 + 4B^2}} \quad \text{Equation 12}$$

$$\cos\beta = \frac{A-C}{\sqrt{(A-C)^2 + 4B^2}} \quad \text{Equation 13}$$

$n_j$ and λ in Equation 4 can be deemed constant during the film 4 in a certain layer is being formed. Then a phase thickness $\delta_j$ in Equation 4 can be deemed in proportion to a physical thickness $d_j$. The physical thickness $d_j$ in turn is in proportion to the time count along the film formation progress, since it is common in forming a thin film to control the film formation rate (the amount of increase in physical thickness per unit time) so that the rate is almost constant throughout the film formation in one layer.

From the above, Equation 11 can be changed into Equation 14: the relational expression regarding the relation between the time points t having one or more theoretical constants $a_k$ and the energy transmittance T. In Equation 14, there are four theoretical constants $a_k$ and k is an integer equal to or greater than 0 (0, 1, 2, 3).

$$= \frac{1}{a_0 + a_1\cos(a_2 t + a_3)} \quad \text{Equation 14}$$

In this embodiment, the function f(t) of the time points t which has the theoretical constant $a_k$ (k=0, 1, 2, 3) is as shown in Equation 15. Equation 15 is obtained by adding, to the right side of Equation 14, a term of compensation constant $a_4$ that is dependent on a light receiver 12 as an optical characteristic measuring device. The compensation constant term is added taking into consideration offset of a detection signal due to dark current of the light receiver 12 or the like.

$$f(t) = T = \frac{1}{a_0 + a_1\cos(a_2 t + a_3)} + a_4 \quad \text{Equation 15}$$

The compensation constant $a_4$ is obtained in advance, for example, before actual film formation using the light receiver 12 to measure the optical characteristic while forming various kinds of films.

The function f(t) is determined as above in this embodiment. The energy transmittance is measured by irradiating the film 4 with the monitoring light at the time points t within the limited time period of from the reference time to the present time. The theoretical constant $a_k$ is compensated by non-linear fitting so as to minimize the difference between the measured value of the energy transmittance and the theoretical value of the optical characteristic (theoretical value of the energy transmittance) which is calculated from the function f(t). A proper constant $a_k'$ is obtained through this compensation.

A designed thickness achieving time at which the optical thickness of the film 4 in the j-th layer being formed reaches the designed thickness is predicted on the basis of the proper constant $a_k'$ (k=0, 1, 2, 3). The film formation is stopped at the designed thickness achieving time predicted.

The designed thickness achieving time is predicted as follows. The value of the objective phase thickness $(2\delta_j+\beta)$ is obtained in advance from the objective optical thickness $n_j d_j$. Then, at a certain time point, the proper constant $a_k'$ (k=0, 1, 2, 3) is obtained which minimizes the difference between the energy transmittance T measured at the time points t prior to the certain time point and the transmittance function f(t). The obtained proper constant is used to set a designed thickness achieving time $t_e$ to a time point at which the optimum $(a_2 t+a_3)$ equals to $(2\delta_j+\beta)$ in value.

This establishes an equation $t_e=\{(2\delta_j+\beta)-a_3'\}/a_2'$. The designed thickness achieving time $t_e$ is thus predicted from this equation.

In manufacturing the optical filter of this embodiment, light having a wavelength identical with the central wavelength is used as the light for irradiating the substrate 3 during film formation (monitoring light), as mentioned above. Therefore it is appropriate to stop formation of the film 4 in each layer at the extremal on the energy transmittance change curve (the relational expression of the optical thickness and the energy transmittance). It has been found that the proper constant $a_k'$ barely changes as the energy transmittance change curve approaches the extremal.

For that reason, prediction of the designed thickness achieving time $t_e$ in this embodiment is carried out when a preset period of time (e.g., 2 to 3 seconds) has elapsed since the amount of change in the proper constant $a_k'$ that is obtained at any time during the film 4 in the j-th layer is being formed has fallen within a preset acceptable range (for example, since the proper constant $a_k'$ has almost ceased to change to gain a fixed value). The film formation is stopped at the designed thickness achieving time $t_e$ predicted.

Figure 2:
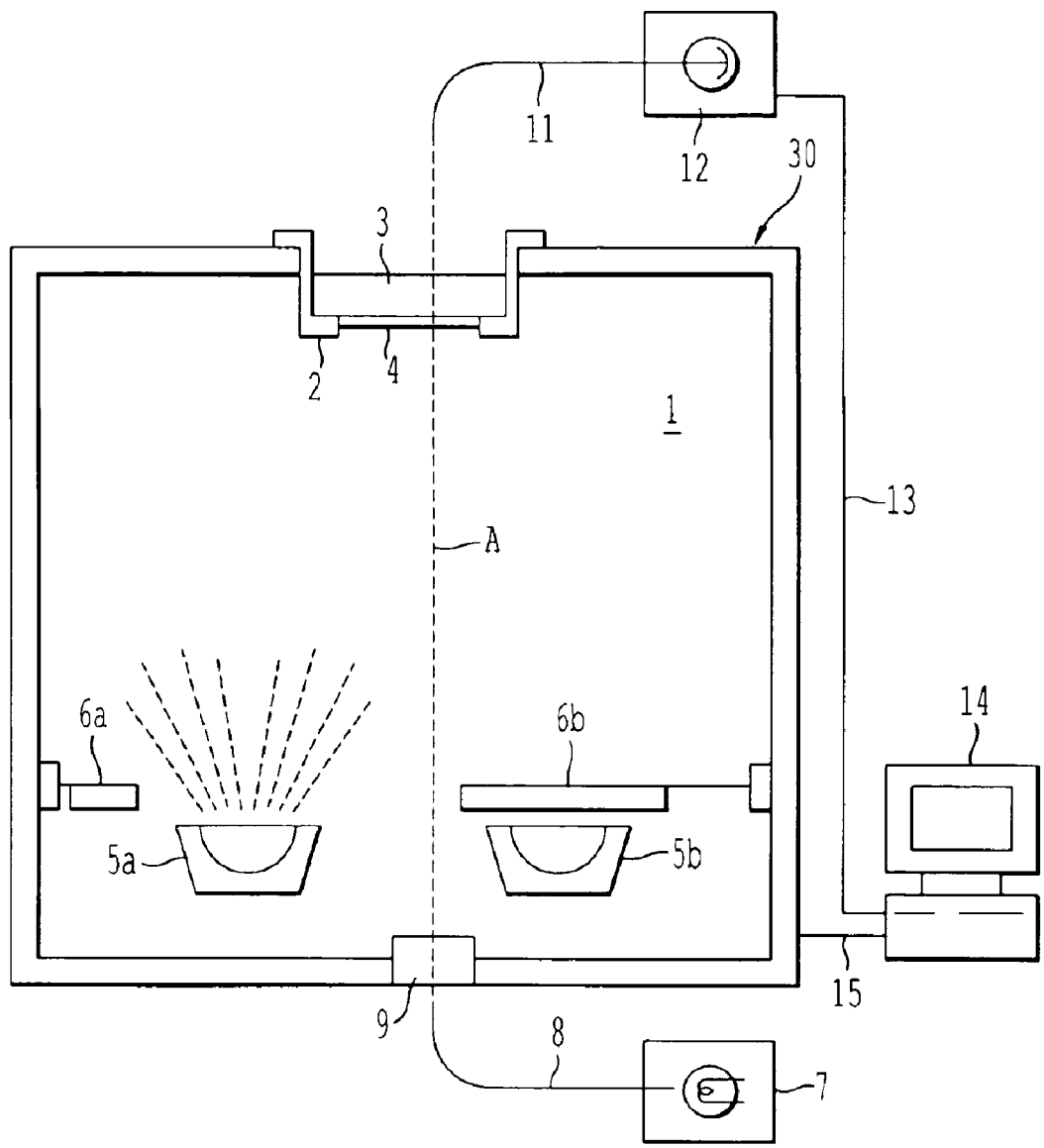
FIG. 2 is a structural diagram schematically showing an example of an apparatus for manufacturing an optical filter.

A computer 14 in FIG. 2 sends a signal for stopping the film formation to a driving unit of the film forming apparatus prior to the predicted time $t_c$. This signal transmission precedes the predicted time $t_c$ by a time period corresponding to sum of the time the stop signal takes to arrive at the driving unit and the time the driving unit takes to stop the film formation. The film formation is thus stopped exactly at the designed thickness achieving time $t_e$.

Fabricated by the above-described method of manufacturing an optical filter, the optical filter of this embodiment makes a band pass filter with an insertion loss of 0.26 dB.

The optical filter of this embodiment is manufactured by stopping formation of each film 4 at the designed thickness achieving time as described in the above. The designed thickness achieving time is predicted as above based on the proper constant $a_k'$ of the function f(t), which has its base on the theoretical formula of the optical characteristic. The film formation can therefore be stopped precisely at the designed thickness achieving time predicted, thereby providing an optical filter that has an optical thickness as designed.

In particular, in this embodiment, the computer 14 sends the stop signal to the driving unit of the film forming apparatus prior to the predicted time $t_e$, and this signal transmission precedes the predicted time $t_e$ by a time period corresponding to sum of the time the stop signal takes to arrive at the driving unit and the time the driving unit takes to stop the film formation. Accordingly, there is no delay accompanying signal processing from the point the stop signal is sent to the point the film formation is stopped. This ensures obtainment of the above optical filter that has an optical thickness exactly as designed.

Moreover, the time for finally stopping the film formation in each layer is calculated in this embodiment with the function f(t) as Equation 15, which is obtained by adding, to the right side of Equation 14, a constant $a_4$ as a result of taking into consideration offset of a detection signal due to dark current of the light receiver 12 or the like. Therefore, the offset does not affect and each film 4 of the optical filter can have an optical thickness that is controlled even more precisely.

The present invention is not limited to the above embodiment but may take various modes. For instance, in the above embodiment, the time series data of the energy transmittance is obtained during the limited time period of from the reference time to the predicted stopping time. Then the designed thickness achieving time is predicted on the basis of the proper constant $a_k'$ (k=0, 1, 2, 3) and the film formation is stopped at the designed thickness achieving time predicted. The time period during which the time series data is to be obtained is not particularly limited but may be set suitably.

The time series data may be obtained, for example, during a limited time period, excluding data of immediately after the film formation starting time (reference time) where the film formation rate is not yet stable.

In the above embodiment, the energy transmittance as the optical characteristic is expressed by the function f(t) and the theoretical constant $a_k$ of the function f(t) is compensated to obtain the proper constant $a_k'$. Alternatively, the energy reflectance may be chosen as the optical characteristic and expressed by the function f(t) to obtain its proper constant $a_k'$ in a similar manner. An energy reflectance R is expressed as R=1−T when the energy transmittance is given as T. Then the function f(t) of the energy reflectance can be obtained by applying the method of obtaining the function f(t) of the energy transmittance from the theoretical formula of the energy transmittance T.

The formation of each film 4 is stopped at the extremal of the energy transmittance in the above embodiment. The reference for stopping formation of each film 4 is not particularly limited but may suitably be set based on the relation between the designed optical thickness and the energy transmittance or the energy reflectance. In accordance with this relation, the method of predicting the designed thickness achieving time on the basis of the proper constant $a_k'$ of the function f(t) may also be set suitably.

According to the method of manufacturing an optical filter of the present invention, the designed thickness achieving time at which the optical thickness of the film being formed reaches the designed thickness is predicted on the basis of the proper constant $a_k'$ of the function f(t), which in turn has its base on the theoretical formula of the optical characteristic of the film on the substrate. The film formation is stopped at the designed thickness achieving time predicted, and hence stopping the film formation is not delayed or the timing for stopping the film formation can not be wrong. The film thus can be formed precisely to have the designed thickness and an optical filter having an accurate optical thickness can be manufactured.

In forming a film of any optical thickness, the prediction of designed thickness achieving time is carried out after the amount of change in the proper constant $a_k'$ falls within an acceptable range, and the film formation is stopped at the designed thickness achieving time predicted. A film having a designed optical thickness thus can be formed precisely.

Furthermore, according to the method of manufacturing an optical filter of the present invention, the function f(t) is a function having a compensation constant term with the constant being dependent on an optical characteristic measuring device. Therefore no error is caused by the offset of the optical characteristic measuring device and the like, whereby a film having a designed thickness can be formed even more precisely.

The optical filter of the present invention, since being fabricated by the method of manufacturing an optical filter as above, can have a film with an optical thickness exactly as designed formed on a substrate. Thus an optical filter of highest quality can be provided.

What is claimed is:

1. A method for manufacturing an optical filter comprising:
    depositing a material on a substrate;
    predicting a deposition stop time during the depositing of the material but prior to reaching the predicted stop time; and
    stopping deposition substantially at the predicted stop time,
    wherein said predicting comprises measuring an optical property of the deposited material at a plurality of times after the start of material deposition, and comparing the measurements to values predicted by a defined functional relationship between said optical property and time of deposition, and
    wherein said functional relationship defines transmittance f(t) as a function of time, and is defined as:

$$f(t) = \frac{1}{a_0 + a_1 \cos(a_2 t + a_3)} + a_4$$

wherein $a_0$, $a_1$, $a_2$, $a_3$, and $a_4$ are constant coefficients.

2. The method of claim 1, wherein said defined functional relationship is theoretically valid at substantially all times during film deposition.

3. An improved method of depositing a layer of material having a desired thickness onto a substrate to form an optical filter, wherein the improvement comprises:
    predicting, during a process of depositing the layer but before reaching said desired thickness, a time at which to stop depositing the film by measuring an optical property of the film and utilizing that measurement to determine a time at which said desired thickness will be reached, wherein said predicting comprises measuring an optical property of the deposited material at a plurality of times after the start of material deposition, and comparing the measurements to values predicted by a defined functional relationship between said optical property and time of deposition, and wherein said functional relationship defines transmittance f(t) as a function of time, and is defined as:

$$f(t) = \frac{1}{a_0 + a_1 \cos(a_2 t + a_3)} + a_4$$

wherein $a_0$, $a_1$, $a_2$, $a_3$, and $a_4$ are constant coefficients.

4. A method for manufacturing an optical filter where a film is formed on a substrate comprising:

measuring an optical characteristic of the filter at selected points in time by irradiating the film with light;

calculating a theoretical value of the optical characteristic utilizing a theoretical formula comprising at least one empirically adjustable constant parameter;

compensating the at least one empirically adjustable constant parameter to provide an adjusted parameter so that the difference between the theoretical value and the measured value of the optical characteristic are minimal;

predicting the optimal time of forming the film with the adjusted parameter; and stopping the forming at the optimal time.

5. The method of claim 4, wherein the optimal time of forming the film is predicted after the amount of change in the adjusted parameter from one selected time to a later selected time falls within a preset range.

6. The method of claim 4, wherein the at least one adjusted parameter is dependant on a device that measures the optical characteristic.

7. The method of claim 4, wherein the optical characteristic is selected from the group consisting of energy transmittance and energy reflectance.

8. An improved method of time controlled deposition of a film onto a substrate to form an optical filter, wherein the improvement comprises:

measuring an optical property of the film;

utilizing the measurement to determine a designed thickness achieving time at which the film will be complete;

predicting, while the film is being deposited, a stop signal initiation time at which to initiate a deposition stop signal that stops the deposition of the film;

wherein the stop signal initiation time is dependent on both the designed thickness achieving time and a time delay between the stop signal initiation time and the actual termination of material deposition; and wherein said predicting comprises measuring an optical property of the deposited material at a plurality of times after the start of material deposition, and comparing the measurements to values predicted by a defined functional relationship between said optical property and time of deposition, and wherein said functional relationship defines transmittance f(t) as a function of time, and is defined as:

$$f(t) = \frac{1}{a_0 + a_1 \cos(a_2 t + a_3)} + a_4$$

wherein $a_0$, $a_1$, $a_2$, $a_3$, and $a_4$ are constant coefficients.

9. A method of manufacturing an optical filter comprising:

depositing a film on a substrate;

measuring the time of the deposition of the film;

measuring transmittance of the filter at regular intervals of time by irradiating the filter;

determining, from the transmittance measurement, the time at which the deposition will be complete using at least in part an equation relating filter transmittance to deposition time having the following functional form:

$$f(t) = \frac{1}{a_0 + a_1 \cos(a_2 t + a_3)} + a_4,$$

wherein $a_0$, $a_1$, $a_2$, $a_3$, and $a_4$ are constant coefficients; and stopping the deposition of the film at the determined time.

10. A method of manufacturing an optical filter comprising a plurality of layers of deposited material, said method comprising:

modeling an optical characteristic of said filter with an equation relating said optical characteristic to deposition time, said equation having a functional form that is theoretically valid at substantially all times during film deposition; and using said model to select a deposition stopping time during film formation, wherein using said model comprises adjusting one or more constant terms in said equation so as to minimize differences between measured values of said optical characteristic and values of said optical characteristic calculated with said equation.

* * * * *

UNITED STATES PATENT AND TRADEMARK OFFICE
CERTIFICATE OF CORRECTION

PATENT NO.   : 6,933,001 B2
DATED        : August 23, 2005
INVENTOR(S)  : Abe et al.

It is certified that error appears in the above-identified patent and that said Letters Patent is hereby corrected as shown below:

Title page,
Item [12], should read -- United States Patent Abe et al. --.
Item [75], Inventors, should read -- Hiroyuki Abe, Tokyo (JP); Yu Mimura, Tokyo (JP); Kazuyou Mizuno, Tokyo (JP) --.
Item [73], Assignee, should read -- The Furukawa Electric Company, Ltd., Yokohama (JP) --.

Signed and Sealed this

Eighth Day of November, 2005

JON W. DUDAS
*Director of the United States Patent and Trademark Office*